(12) United States Patent
Jung et al.

(10) Patent No.: US 8,896,236 B2
(45) Date of Patent: Nov. 25, 2014

(54) ORGANIC LIGHT EMITTING DIODE DISPLAY

(75) Inventors: Hae-Goo Jung, Yongin (KR); Do-Hyung Ryu, Yongin (KR); Kuen-Dong Ha, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 157 days.

(21) Appl. No.: 13/478,060

(22) Filed: May 22, 2012

(65) Prior Publication Data

US 2013/0020967 A1 Jan. 24, 2013

(30) Foreign Application Priority Data

Jul. 21, 2011 (KR) .................. 10-2011-0072627

(51) Int. Cl.
| | |
|---|---|
| H05B 37/00 | (2006.01) |
| H01L 27/32 | (2006.01) |
| H05B 33/08 | (2006.01) |
| H01L 51/52 | (2006.01) |

(52) U.S. Cl.
CPC ......... *H01L 27/3276* (2013.01); *H01L 51/5259* (2013.01); *H05B 33/0896* (2013.01); *H01L 51/5243* (2013.01); *Y02B 20/36* (2013.01)
USPC ...................... 315/312; 257/91; 257/E21.019

(58) Field of Classification Search
USPC ......... 438/161, 261, 573, 578, 605, 652, 666, 438/FOR. 340, FOR. 344, FOR. 345, 438/FOR. 347, FOR. 349; 313/238, 244, 313/248, 255, 257; 257/88, E27.119, 40; 315/291, 312, 326
See application file for complete search history.

(56) References Cited

U.S. PATENT DOCUMENTS

| | | | | |
|---|---|---|---|---|
| 2002/0027247 | A1* | 3/2002 | Arao et al. ..................... | 257/347 |
| 2008/0157661 | A1* | 7/2008 | Kajikawa et al. ............ | 313/504 |
| 2012/0026074 | A1* | 2/2012 | Lee et al. ........................ | 345/76 |

FOREIGN PATENT DOCUMENTS

| | | |
|---|---|---|
| JP | 2003-178885 A | 6/2003 |
| JP | 2008-166181 A | 7/2008 |
| KR | 10-2006-0025774 A | 3/2006 |
| KR | 10-2007-0103507 A | 10/2007 |
| KR | 10-2011-0130926 A | 12/2011 |
| KR | 10-2012-0042032 | 5/2012 |
| WO | WO 2010089681 A1 * | 8/2010 |

* cited by examiner

*Primary Examiner* — Tuyet Thi Vo
*Assistant Examiner* — Henry Luong
(74) *Attorney, Agent, or Firm* — Christie, Parker & Hale, LLP

(57) ABSTRACT

An organic light emitting diode (OLED) display is provided. The OLED display includes: a substrate; an organic light emitting element including a first electrode on the substrate, an organic emission layer on the first electrode, and a second electrode on the organic emission layer; and an encapsulation member encapsulating the organic light emitting element and including a first conductive layer on the organic light emitting element and electrically connected to the second electrode, an insulation layer on the first conductive layer, and a second conductive layer on the insulation layer and configured to electrically connect to the first electrode.

6 Claims, 7 Drawing Sheets

(a)

(b)

ORGANIC LIGHT EMITTING DIODE DISPLAY

CROSS-REFERENCE TO RELATED APPLICATION

This application claims priority to and the benefit of Korean Patent Application No. 10-2011-0072627, filed in the Korean Intellectual Property Office on Jul. 21, 2011, the entire content of which is incorporated herein by reference.

BACKGROUND

1. Field

Aspects of embodiments of the present invention relate generally to an organic light emitting diode (OLED) display.

2. Description of Related Art

Display devices display images. Recently, an organic light emitting diode (OLED) display has been in the spotlight. Unlike a liquid crystal display, the OLED display has a self-emitting characteristic and does not need a separate light source. Accordingly, the thickness and weight of the OLED display are decreased compared to that of a liquid crystal display. In addition, the OLED display has high-grade characteristics such as low power consumption, high luminance, high reaction speed, and the like.

The OLED display includes a substrate, an OLED disposed on the substrate for displaying an image, and an encapsulation member facing the substrate and encapsulating the OLED. Recent increases in the size of an OLED display have complicated the entire structure and manufacturing process of the OLED display.

The above information disclosed in this Background section is only for enhancement of understanding of the background of embodiments of the present invention and therefore it may contain information that does not form the prior art that is already known in this country to a person of ordinary skill in the art.

SUMMARY

Aspects of embodiments of the present invention relate to an OLED display including an encapsulation member electrically connected to an organic light emitting element. Embodiments of the present invention provide an organic light emitting diode (OLED) display that can stably supply power to an organic light emitting element. Further embodiments of the present invention provide an encapsulation member for an OLED display that can simplify the entire structure and manufacturing process of the OLED display.

According to an exemplary embodiment of the present invention, an organic light emitting diode (OLED) display is provided. The OLED display includes: a substrate; an organic light emitting element including a first electrode on the substrate, an organic emission layer on the first electrode, and a second electrode on the organic emission layer; and an encapsulation member encapsulating the organic light emitting element, and including a first conductive layer on the organic light emitting element and electrically connected to the second electrode, an insulation layer on the first conductive layer, and a second conductive layer on the insulation layer, and configured to electrically connect to the first electrode.

The insulation layer may have a first connection opening having a first width and exposing a part of the first conductive layer, the second conductive layer may have a second connection opening having a second width that is larger than the first width and exposing the first connection opening and the exposed part of the first conductive layer, and the OLED display may further include a driver for connecting to and supplying a first power to the first conductive layer through the first connection opening and the second connection opening.

The driver may be configured to connect to and supply a second power to the second conductive layer.

The driver may be configured to attach to the second conductive layer by using a magnetic force.

The OLED display may further include: a first pad at an outer area of the substrate and establishing electric connection between the first electrode and the second conductive layer; and a second pad at an outer area of the substrate, the second pad for electrically connecting the second electrode and the first conductive layer.

The encapsulation member may further include a conducting pattern separated from and in a same layer as the first conductive layer, the conducting pattern for electrically connecting the second conductive layer and the first pad.

The encapsulation member may further include a conductive connection portion for electrically connecting the conducting pattern and the second conductive layer through the insulation layer.

Embodiments of the present invention provide for an OLED display that can stably provide power to an organic light emitting element.

DETAILED DESCRIPTION

Figure 1:
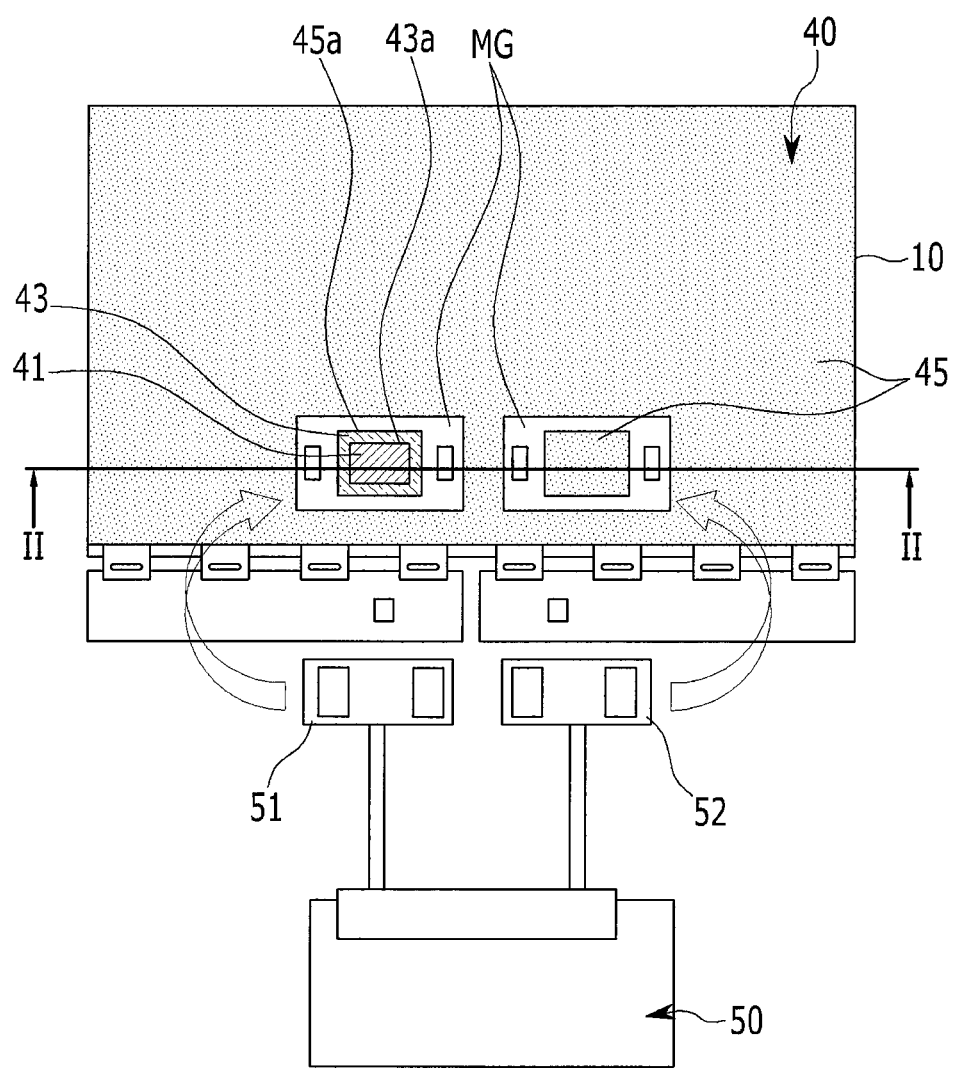
FIG. 1 is a top plan view of an organic light emitting diode (OLED) display according to an exemplary embodiment.

The present invention will be described more fully hereinafter with reference to the accompanying drawings, in which exemplary embodiments are shown. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the application.

In addition, the size and thickness of each component shown in the drawings are arbitrarily shown for understanding and ease of description, but the present invention is not limited thereto. Further, the thickness or area of layers, films, panels, regions, etc., may be exaggerated for clarity. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising," will be understood to imply the inclusion of stated elements but not the exclusion of any other elements. Further, throughout the specification, "on" implies being positioned above or below a target element and does not imply being necessarily positioned on the top on the basis of a gravity direction.

Hereinafter, an organic light emitting diode (OLED) display according to an exemplary embodiment will be described with reference to FIG. 1 to FIG. 7.

Figure 2:
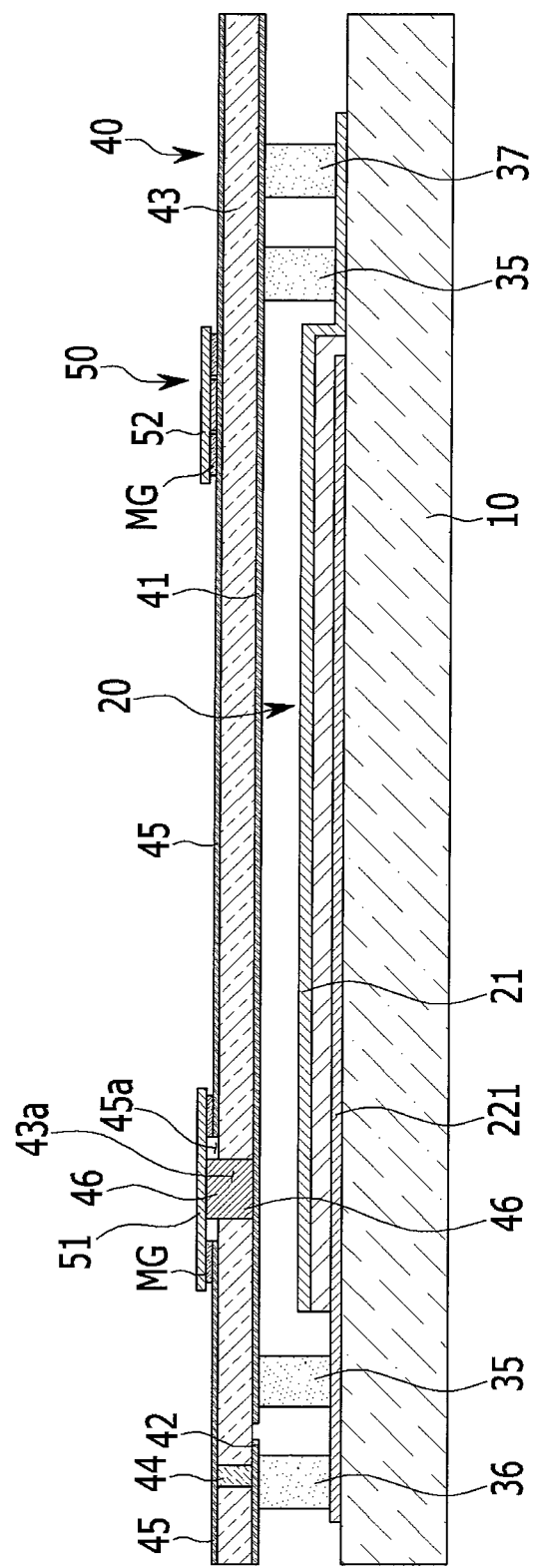
FIG. 2 is a cross-sectional view of FIG. 1, taken along the line II-II.

FIG. 1 is a top plan view of an OLED display according to an exemplary embodiment. FIG. 2 is a cross-sectional view of FIG. 1, taken along the line II-II.

As shown in FIG. 1 and FIG. 2 (and partially in FIG. 4), the OLED display includes a substrate 10, a display portion 20, a bonding layer 35, a first conductive bonding layer 36, a second conductive bonding layer 37, a sealing member (or encapsulation member) 40, and a driver 50. The substrate 10 may include materials such as polymer, metal, glass, or quartz, and is formed of a transparent insulating material. An image displayed by the display portion 20 is viewed from the outside through the substrate 10.

The display portion 20 includes a plurality of pixels, and a driving circuit and an organic light emitting element 25 (see FIG. 4) controlled by the driving circuit are provided in each pixel. The driving circuit includes at least two thin film transistors including a switching thin film transistor and a driving thin film transistor 60 (see FIG. 4) and at least one capacitor. The organic light emitting element includes a first electrode 23 (see FIG. 4), an organic emission layer 24 (see FIG. 4), and a second electrode 21.

One of the first and second electrodes is a hole injection electrode (anode) and the other is an electron injection electrode (cathode). The first electrode 23 is disposed in each pixel and electrically connected to the driving thin film transistor 60 of the corresponding pixel. On the other hand, the second electrode 21 is commonly disposed over the plurality of pixels. Here, the pixel refers to a minimum unit displaying an image or unit of light.

Further, a gate line, data line, and a common power line 221 are provided in each pixel of the display portion 20. The gate line transmits a scan signal and the data line transmits a data signal. The common power line 221 applies a common voltage to the driving thin film transistor 60.

Light emitted from the display portion 20 passes through the substrate 10 and then is emitted to the outside. A detailed structure of the display portion 20 will be described later, and FIG. 2 schematically illustrates the display portion 20 including the common power line 221 and the second electrode 21 in three layers.

Hereinafter, the display portion 20 will be described in further detail with reference to FIG. 3 and FIG. 4.

Figure 3:
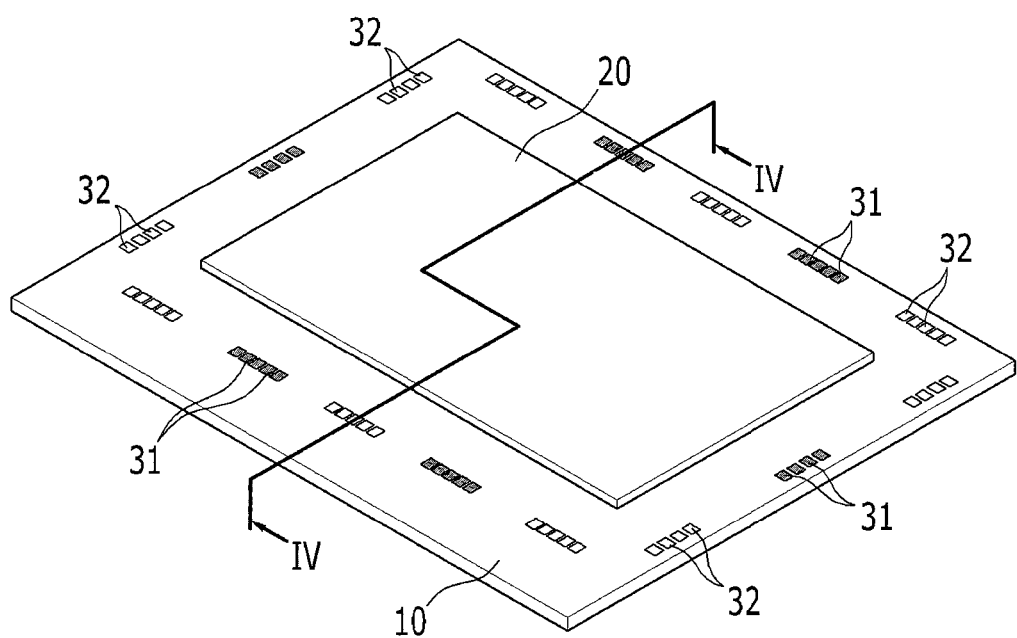
FIG. 3 is a perspective view of the substrate where an organic light emitting element is formed in the OLED display of FIG. 1.

FIG. 3 is a perspective view of the substrate 10 where the organic light emitting element is disposed in the OLED display of FIG. 1. FIG. 4 is a cross-sectional view of FIG. 3, taken along the line IV-IV.

Figure 4:
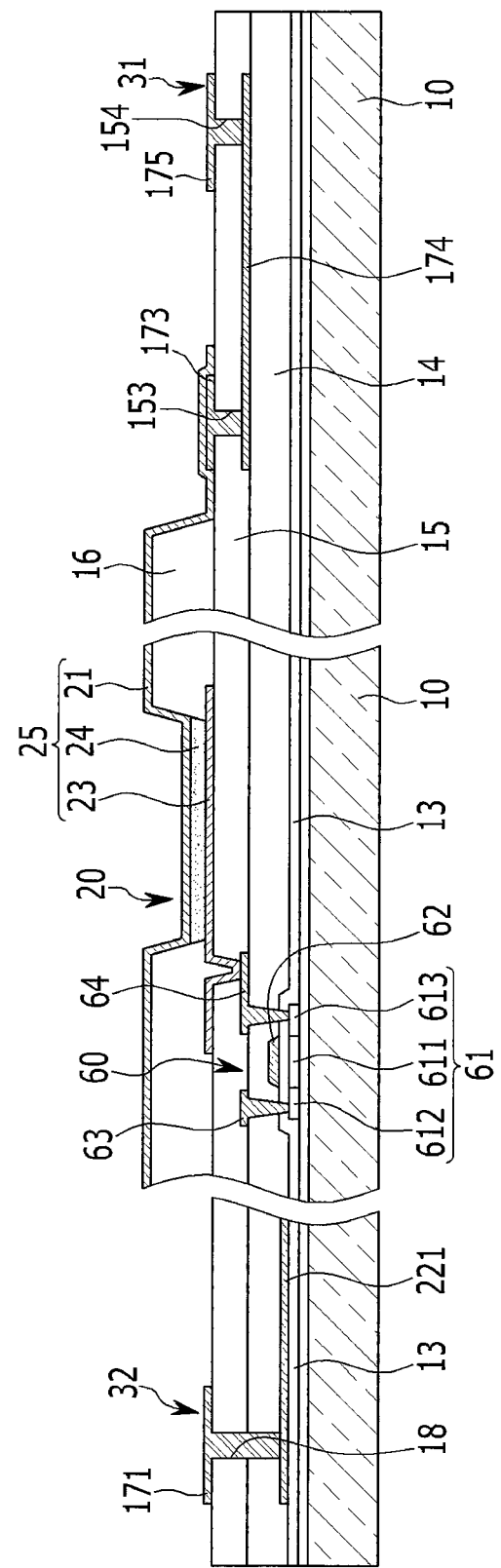
FIG. 4 is a cross-sectional view of FIG. 3, taken along the line IV-IV.

As shown in FIG. 3 and FIG. 4, first pads 32 and second pads 31 are disposed at an outer area of the substrate 10, that is, outside of the display portion 20. The first pads 32 and the second pads 31 may be concurrently (for example, simultaneously) formed when the display portion 20 is formed. The first pads 32 are electrically connected to the common power line 221 of the display portion 20. The second pads 31 are electrically connected to the second electrode 21 of the display portion 20. The first pads 32 and the second pads 31 surround the display portion 20 by being disposed at the outside of the four edges of the display portion 20, and they are disposed in parallel with each other at a distance from each other.

In further detail, each pixel of the display portion 20 includes an organic light emitting element 25 and a driving circuit. The driving circuit includes at least two thin film transistors and at least one capacitor. FIG. 4 schematically illustrates one thin film transistor 60 (a driving thin film transistor) and one organic light emitting element 25 that are provided in the display portion 20, and a getter layer is omitted.

The thin film transistor 60 includes a semiconductor layer 61, a gate electrode 62, a source electrode 63, and a drain electrode 64. The semiconductor layer 61 may be made of a polysilicon layer, and includes a channel area 611, a source area 612, and a drain area 613. The channel area 611 is an intrinsic semiconductor that is not doped with an impurity. The source area 612 and the drain area 613 are impurity semiconductors that are doped with an impurity.

The gate electrode 62 is disposed on the channel area 611 of the semiconductor layer 61, interposing a gate insulating layer 13 therebetween. The source electrode 63 and the drain electrode 64 are disposed above the gate electrode 62, interposing an interlayer insulating layer 14 therebetween, and respectively electrically connected to the source area 612 and the drain area 613 through contact holes in the interlayer insulating layer 14 and the gate insulating layer 13. A planarization layer 15 is disposed on the source electrode 63 and the drain electrode 64, and the first electrode 23 is disposed on the planarization layer 15. The first electrode 23 is electrically connected to the drain electrode 64 through a contact hole in the planarization layer 15.

A pixel defining layer 16 is disposed on the first electrode 23 and the planarization layer 15. The pixel defining layer 16 includes an opening in each pixel to expose a part of the first electrode 23. The organic emission layer 24 is disposed on the exposed part of the first electrode 23, and the second electrode 21 is disposed over the entire area of the display portion 20 to cover the organic emission layer 24 and the pixel defining layer 16. The first electrode 23, the organic emission layer 24, and the second electrode 21 form the organic light emitting element 25.

The first electrode 23 may be a hole injection electrode and the second electrode 21 may be an electron injection electrode. In this case, the organic emission layer 24 is made of a hole injection layer (HIL), a hole transport layer (HTL), an emission layer, an electron transport layer (ETL), and an electron injection layer (EIL) that are sequentially stacked on the first electrode 23. When the driver 50 supplies power to the first electrode 23 and the second electrode 21, holes and electrons are injected into the organic emission layer 24 from the first and second electrodes 23 and 21. When an exciton, which is a combination of the hole and electron injected into the organic emission layer 24, falls from an excited state to a ground state, light emission occurs.

The first electrode 23 is made of a transmissive conductive layer and the second electrode 21 is made of a reflective conductive layer. Light emitted from the organic emission layer 24 is reflected by the second electrode 21 and then emitted to the outside through the substrate 10. This is called a bottom emission type light emission structure. The first electrode 23 may be made of a triple layer of indium tin oxide (ITO)/silver (Ag)/ITO, and the second electrode 21 may include silver (Ag) or aluminum (Al).

The common power line 221 is disposed on the same layer where the gate electrode 62 is disposed. However, the common power line 221 may be formed in the same layer where one of the source electrode 63 and the drain electrode 64 is formed. An end portion of the common power line 221 is extended to the outer side of the display portion 20. In addition, at least one insulation layer among four insulation layers in the display portion 20 is extended to the outer side of the display portion 20. For example, the end portion of the common power line 221 is covered by the interlayer insulating layer 14 and the planarization layer 15, but the end portion of the common power line 221 may instead be covered by the planarization layer 15. The common power line 221 is electrically connected to the thin film transistor 60 and accordingly, it is electrically connected to the first electrode 23.

The interlayer insulating layer 14 and the planarization layer 15 include a first opening 18 to expose the end portion of the common power line 221. A first pad conductive layer 171 is disposed on the planarization layer 15 and electrically connected to the common power line 221 through the first opening 18. In FIG. 3, the first pad 32 disposed at the outer area of the substrate 10 may be defined as the first pad conductive layer 171. The first pad conductive layer 171 may be disposed on the same layer where the first electrode 23 is disposed, and may be made of the same material as the first electrode 23. As described above, the first pad 32 is electrically connected to the first electrode 23 through the common power line 221 and the thin film transistor 60.

The second electrode 21 is disposed at an inner portion of the substrate 10 and the second pad 31 is disposed at an outer portion of the substrate 10. The second pad 31 includes a third pad conductive layer 173, a fourth pad conductive layer 174, and a fifth pad conductive layer 175.

The third pad conductive layer 173 is disposed at the inner portion of the substrate 10 and contacts the second electrode 21. The fourth pad conductive layer 174 is electrically connected to the third pad conductive layer 173 through a third opening 153 of the planarization layer 15, and disposed over the inner and outer portions of the substrate 10. The fifth pad conductive layer 175 is disposed at the outer portion of the substrate 10, and is electrically connected to the fourth pad conductive layer 174 through a fourth opening 154 of the planarization layer 15.

The third pad conductive layer 173 and the fifth pad conductive layer 175 may be disposed on the same layer where the first electrode 23 is disposed and may be made of the same material of the first electrode 23. In addition, the fourth pad conductive layer 174 may be disposed on the same layer where the source electrode 63 and the drain electrode 64 are disposed and may be made of the same material as the source electrode 63 and the drain electrode 64. The detailed structure of the second pad 31 is not limited to that shown in FIG. 4. In other embodiments, any suitable structure in which the second electrode 21 of the display portion 20 is electrically connected to the outer side of the display portion 20 may be used. As described above, the second pad 31 is electrically connected to the second electrode 21.

FIG. 4 exemplarily illustrates the display portion 20. Thus, the present invention is not limited thereto, and in other embodiments, the structures of the thin film transistor 60 and the organic light emitting element 25 may be variously modified.

Referring back to FIG. 2, the bonding layer 35 is disposed to surround the display portion 20 at the outer side of the display portion 20. The bonding layer 35 may include an ultraviolet (UV) curable resin or a thermosetting resin, and for example may include an epoxy resin. A getter layer may be disposed between the display portion 20 and the bonding layer 35, and a moisture-absorbing filler may be disposed between the substrate 10 and the encapsulation member 40 at an inner side of the bonding layer 35.

The first conductive bonding layer 36 is disposed at an outer side of the bonding layer 35, and establishes electrical connections between the encapsulation member 40 and the first pad 32. The second conductive bonding layer 37 is also disposed at an outer side of the bonding layer, and establishes electrical connections between the encapsulation member 40 and the second pad 31. The electrical connections established by the first conductive bonding layer 36 and the second conductive bonding layer 37 will be described in detail later.

Hereinafter, a structure that connects the encapsulation member 40 and the display portion 20 will be described in further detail with reference to FIG. 5 to FIG. 7.

Figure 5:
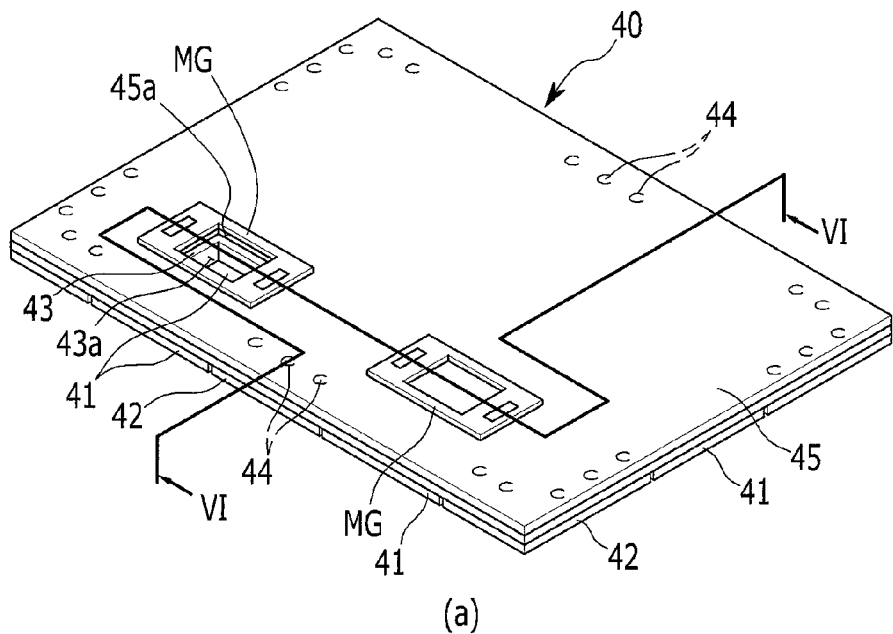
FIG. 5, which includes FIG. 5(*a*) and FIG. 5(*b*), are perspective views of two sides of the encapsulation member in the OLED display of FIG. 1.
Figure 5:
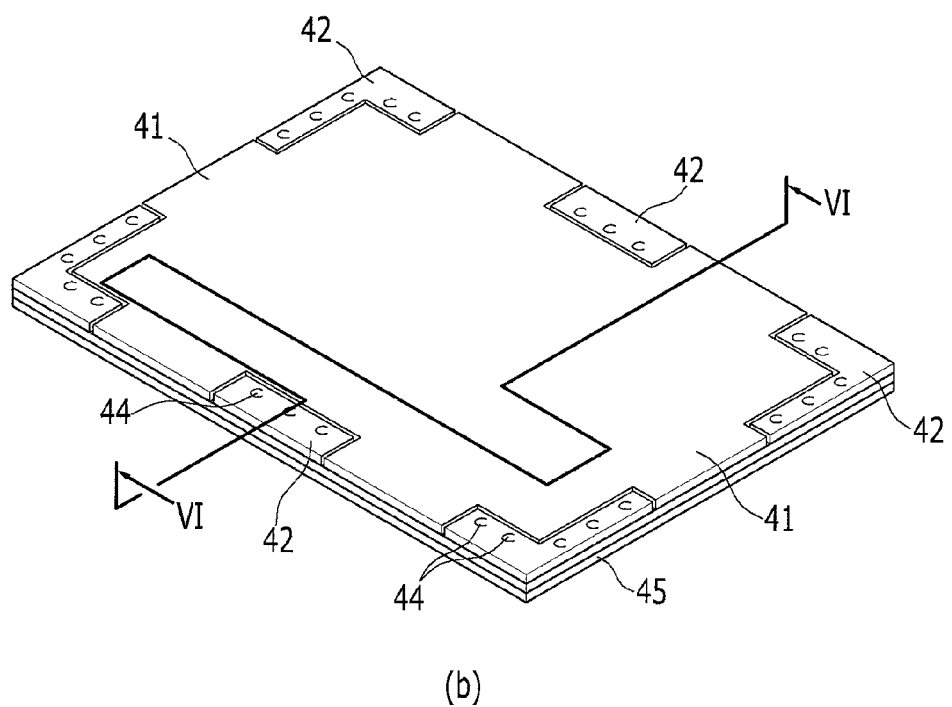

FIG. 5, which includes FIG. 5(*a*) and FIG. 5(*b*), are perspective views of two sides of the encapsulation member 40 in the OLED display of FIG. 1. FIG. 5(*a*) is a perspective view of a second conductive layer 45 of the encapsulation member 40 (that is, the top side of the encapsulation member 40). FIG. 5(*b*) is a perspective view of a first conductive layer 41 of the encapsulation member 40 (that is, the bottom side of the encapsulation member 40, which is the side that faces the substrate 10 and the display portion 20). FIG. 6 is a cross-sectional view of FIG. 5, taken along the line VI-VI. FIG. 7 is a detailed cross-sectional view of the OLED display of FIG. 1.

Figure 6:
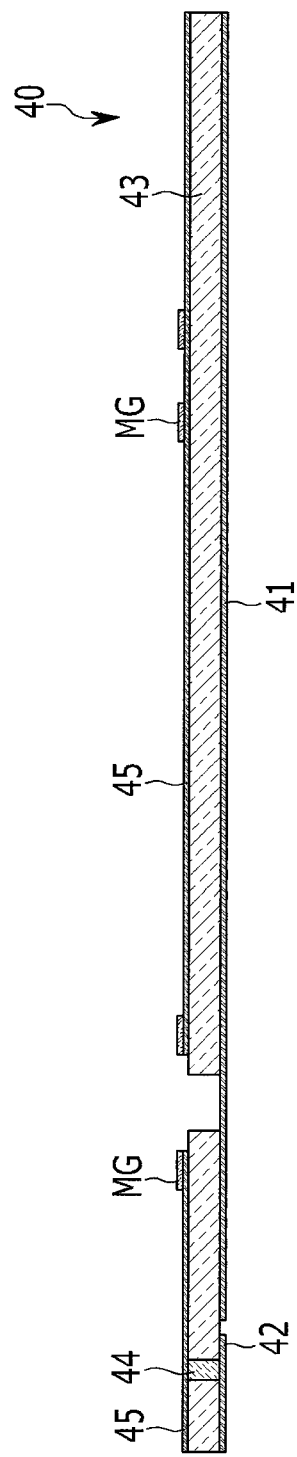
FIG. 6 is a cross-sectional view of FIG. 5, taken along the line VI-VI.
Figure 7:
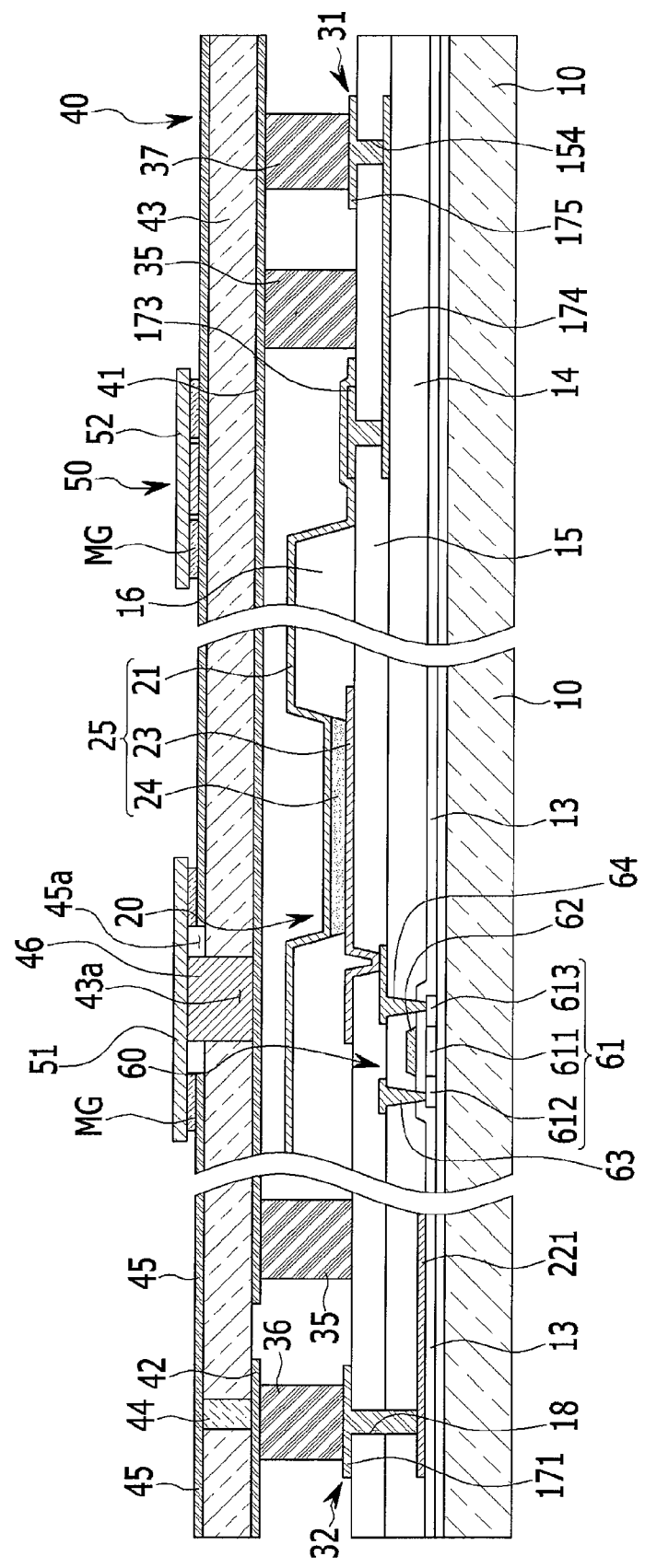
FIG. 7 is a detailed cross-sectional view of the OLED display of FIG. 1.

As shown in FIG. 5 to FIG. 7 (as well as FIG. 1 and FIG. 2), the encapsulation member 40 encapsulates the display portion 20 including the organic light emitting element 25, and may be formed using a roll-to-roll process and a trim process. The encapsulation member 40 includes the first conductive layer 41, a conducting pattern 42, an insulation layer 43, a first conductive connection portion 44, and the second conductive layer 45.

The first conductive layer 41 is disposed on the display portion 20 including the organic light emitting element 25. As shown in FIG. 5(*b*) and FIG. 7, the location of the first conductive layer 41 corresponds to the second pad 31 and the entire area of the display portion 20, excluding an area corresponding to the first pad 32. The first conductive layer 41 is electrically connected to the second pad 31 through the second conductive bonding layer 37. That is, the first conductive layer 41 is electrically connected to the second electrode 21 of the organic light emitting element 25 through the second pad 31. The first conductive layer 41 may include various types of conductive metal such as copper, platinum, gold, silver, nickel, tin, aluminum, and the like, or a conductive polymer.

The conducting pattern 42 is disposed at a distance from the first conductive layer 41 on the same layer where the first conductive layer 41 is disposed. The conducting pattern 42 is disposed corresponding to the first pad 32, and is electrically connected to the first pad 32 through the first conductive bonding layer 36.

The insulation layer 43 is disposed between the first conductive layer 41 and the second conductive layer 45. The insulation layer 43 may attach to the first conductive layer 41 and the second conductive layer 45 by placing adhesive layers respectively between the insulation layer 43 and the first conductive layer 41 and between the insulation layer 43 and the second conductive layer 45. The insulation layer 43 may have the same or similar dimensions (for example, a same or similar width) as the second conductive layer 45, which helps prevent or reduce undesired short-circuits between the first conductive layer 41 and the second conductive layer 45.

The insulation layer 43 may be made of a resin such as polyethylene terephthalate (PET), polyimide (PI), polycarbonate (PC), and the like, and has a stronger construction that is more resistant to bending than the first and second conductive layers 41 and 45. As described above, the bending strength of the insulation layer 43 is higher than that of the first and second conductive layers 41 and 45, and the insulation layer 43 attaches to the first and second conductive layers 41 and 45. Accordingly, the insulation layer 43 reinforces the strength of the first and second conductive layers 41 and 45 so that deformation of the encapsulation member 40 due to external interference can be reduced or minimized. The insulation layer 43 includes a first connection opening 43a having a first width and exposing a part of the first conductive layer 41. The first connection opening 43a may be formed by a punching process.

The first conductive connection portion 44 is disposed in the same layer where the insulation layer 43 is disposed and penetrates the insulation layer 43. In addition, the first conductive connection portion 44 electrically connects the conducting pattern 42 and the second conductive layer 45.

The second conductive layer 45 is disposed on the insulation layer 43, corresponding to the entire area of the display portion 20. The second conductive layer 45 is electrically connected to the first pad 32 through the first conductive connection portion 44, the conducting pattern 42, and the first conductive bonding layer 36. That is, the second conductive layer 45 is electrically connected to the first electrode 23 by being electrically connected to the first pad 32 that is electrically connected to the first electrode 23. The second conductive layer 45 may include various types of conductive metal such as copper, platinum, gold, silver, nickel, tin, aluminum, and the like, or a conductive polymer.

The second conductive layer 45 includes a second connection opening 45a having a second width that is larger than the first width of the first connection opening 43a of the insulation layer 43 to expose the first connection opening 43a and the exposed part of the first conductive layer 41. The second connection opening 45a may be formed by a punching process. Since the width of the second connection opening 45a of the second conductive layer 45 is larger than that of the first connection opening 43a of the insulation layer 43, undesired short-circuits between the first conductive layer 41 and the second conductive layer 45 can be reduced or prevented.

The present invention is not limited to the described embodiment of FIGS. 5-7. In other embodiments, a second connection opening of a second conductive layer of an OLED display may have a width that is the same as a first width of a first connection opening of an insulation layer.

The driver 50 is disposed at an outer side (or outside) of the substrate 10, as shown in FIG. 1. The driver 50 includes a first connecting terminal 51 and a second connecting terminal 52.

The first connecting terminal 51 is attached to and electrically insulated from the second conductive layer 45 using magnetic force of a magnetic substance MG. In addition, the first connecting terminal 51 is electrically connected to the exposed part of the first conductive layer 41 through the first and second connection openings 43a and 45a via a second conductive connection portion 46. In other embodiments, the first connecting terminal 51 may be attached to the second conductive layer 45 using a bonding member such as an adhesive tape.

The driver 50 supplies a first power to the first conductive layer 41 through the first connecting terminal 51 and the second conductive connection portion 46, and the first power supplied to the first conductive layer 41 is supplied to the second electrode 21 through the first conductive layer 41, the second conductive bonding layer 37, and the second pad 31.

The first connecting terminal 51 may be attached to (and electrically insulated from) any portion of the second conductive layer 45.

The second connecting terminal 52 is attached to and electrically connected to the second conductive layer 45 using a magnetic force of a magnetic substance MG. In further detail, the magnetic substance MG may be attached to the second conductive layer 45 using an adhesive member such as an adhesive tape, and the second connecting terminal 52 is attached to the magnetic substance MG such that the second connecting terminal 52 is electrically connected to the second conductive layer 45. In other embodiments, the second connecting terminal 52 may be attached to and electrically connected to the second conductive layer 45 using an adhesive member such as an adhesive tape.

The driver 50 supplies a second power to the second conductive layer 45 through the second connecting terminal 52, and the second power supplied to the second conductive layer 45 is supplied to the first electrode 23 through the second conductive layer 45, the first conductive connection portion 44, the conducting pattern 42, the first conductive bonding layer 36, the first pad 32, and the common power line 221. The second connecting terminal 52 may be attached to (and electrically connected to) any portion of the second conductive layer 45.

As described above, in the OLED display according to the exemplary embodiment of FIG. 7, the first pad 32 and the second pad 31 are provided to surround the display portion 20. Further, the first power and the second power supplied from the driver 50 are respectively supplied to the second pad 31 and the first pad 32 through the encapsulation member 40. The first power and the second power are then supplied to the second electrode 21 and the first electrode 23, respectively, so that the second electrode 21 and the first electrode 23 can be uniformly supplied with the first power and second power, respectively, from the driver 50.

Thus, even if the size of the display portion 20 of the OLED display according to the exemplary embodiment of FIG. 7 is increased, the voltage drop (IR drop) of the power supplied to the display portion 20 can be reduced or minimized so that luminance uniformity of an image displayed by the display portion 20 can be improved. This luminance uniformity improves the display quality of an image viewed from the OLED display.

In particular, the display portion 20 can be provided with power without limiting the location of the power application by attaching the first connecting terminal 51 and the second connecting terminal 52 to any portion of the second conductive layer 45. In this fashion, the power can be supplied to the first electrode 23 and the second electrode 21 by attaching the first electrode 23 and the second electrode 21 to an appropriate location of the second conductive layer 45 so that the voltage drop of the power supplied to the display portion 20 can be reduced or minimized. This improves luminance uniformity of an image displayed by the display portion 20.

In addition, in the OLED display according to the exemplary embodiment of FIG. 7, the first power and the second power supplied from the driver 50 are respectively supplied to the second pad 31 and the first pad 32 through the encapsulation member 40, and then supplied to the second electrode 21 and the first electrode 23. Therefore, the number of TAB films supplying power to the second electrode 21 and the first electrode 23 may be reduced so that both a failure rate of the OLED display can be reduced and material cost for the TAB film can be reduced, thereby reducing the manufacturing cost of the OLED display. Further, as the number of the TAB films is reduced, the entire structure of the OLED display can be simplified.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF SOME OF THE REFERENCE NUMERALS substrate 10, first electrode 23, second electrode 21, organic light emitting element 25, first conductive layer 41, insulation layer 43, second conductive layer 45, encapsulation member 40.

What is claimed is:

1. An organic light emitting diode (OLED) display comprising:
    a substrate;
    an organic light emitting element comprising a first electrode on the substrate, an organic emission layer on the first electrode, and a second electrode on the organic emission layer; and
    an encapsulation member encapsulating the organic light emitting element, and comprising a first conductive layer on the organic light emitting element and electrically connected to the second electrode, an insulation layer on the first conductive layer, and a second conductive layer on the insulation layer, and configured to electrically connect to the first electrode, wherein
    the insulation layer has a first connection opening having a first width and exposing a part of the first conductive layer,
    the second conductive layer has a second connection opening having a second width that is larger than the first width and exposing the first connection opening and the exposed part of the first conductive layer, and
    the OLED display further comprises a driver for connecting to and supplying a first power to the first conductive layer through the first connection opening and the second connection opening.

2. The OLED display of claim 1, wherein the driver is configured to connect to and supply a second power to the second conductive layer.

3. The OLED display of claim 2, wherein the driver is configured to attach to the second conductive layer by using a magnetic force.

4. The OLED display of claim 1, further comprising: a first pad at an outer area of the substrate and establishing electric connection between the first electrode and the second conductive layer; and a second pad at an outer area of the substrate, the second pad for electrically connecting the second electrode and the first conductive layer.

5. The OLED display of claim 4, wherein the encapsulation member further comprises a conducting pattern separated from and in a same layer as the first conductive layer, the conducting pattern for electrically connecting the second conductive layer and the first pad.

6. The OLED display of claim 5, wherein the encapsulation member further comprises a conductive connection portion for electrically connecting the conducting pattern and the second conductive layer through the insulation layer.

* * * * *